(12) United States Patent
Yamasaki et al.

(10) Patent No.: US 8,126,064 B2
(45) Date of Patent: Feb. 28, 2012

(54) TRANSMISSION DEVICE

(75) Inventors: Masahiro Yamasaki, Osaka (JP); Shinetsu Katou, Osaka (JP); Sadayoshi Kanazawa, Osaka (JP)

(73) Assignee: Panasonic Corporation, Osaka (JP)

( * ) Notice: Subject to any disclaimer, the term of this patent is extended or adjusted under 35 U.S.C. 154(b) by 819 days.

(21) Appl. No.: 12/243,235

(22) Filed: Oct. 1, 2008

(65) Prior Publication Data
US 2009/0115897 A1   May 7, 2009

(30) Foreign Application Priority Data
Oct. 1, 2007   (JP) .................................. 2007-257328

(51) Int. Cl.
*H04N 7/12* (2006.01)
*H04N 7/00* (2011.01)

(52) U.S. Cl. ......... 375/240.28; 375/240.26; 375/240.27; 348/484; 348/485; 348/486; 348/515

(58) Field of Classification Search .............. 375/240.28
See application file for complete search history.

(56) References Cited

U.S. PATENT DOCUMENTS

| | | | |
|---|---|---|---|
| 5,504,774 A | 4/1996 | Takai et al. | |
| 5,646,941 A | 7/1997 | Nishimura et al. | |
| 5,912,869 A | 6/1999 | Tanaka et al. | |
| 6,429,364 B1 | 8/2002 | Muraki et al. | |
| 6,504,919 B1 | 1/2003 | Takagi et al. | |
| 6,738,421 B1 | 5/2004 | Ueno | |
| 6,744,777 B1 | 6/2004 | Takatsuji et al. | |
| 6,993,092 B1 | 1/2006 | Murakami et al. | |
| 7,421,527 B2 | 9/2008 | Nakamura et al. | |
| 2004/0252235 A1 | 12/2004 | Ejima | |
| 2007/0247550 A1* | 10/2007 | Plaunt | 348/515 |

FOREIGN PATENT DOCUMENTS
JP   2004-23187   6/2002

OTHER PUBLICATIONS

English language Abstract of JP 2004-23187, Jun. 12, 2002.
Shibata, Osamu, "Basic Knowledge of HDMI—What You Need to Know before Starting Development," Design Wave Magazine, pp. 73-81 (Apr. 2008).
English language translation of Shibata, Osamu, "Basic Knowledge of HDMI—What You Need to Know before Starting Development."

* cited by examiner

*Primary Examiner* — Longbit Chai
(74) *Attorney, Agent, or Firm* — Greenblum & Bernstein, P.L.C.

(57) ABSTRACT

The identification information processing unit receives identification information identifying the reception device from a reception device, and generates decoded identification information indicating the decoded value of the received identification information. The parameter value selection unit selects the first parameter value when the decoded identification information includes an information representing a television, selects a second parameter value that is less than the first parameter value when the decoded identification information includes an information representing an audio device, and generates a selected parameter value. The frequency divider frequency divides the audio clock using the selected parameter value, and generates a frequency division signal. The counter counts one period of the frequency division signal using the pixel clock and generates the cycle time stamp. The transmission device then sends the selected parameter value and cycle time stamp to the reception device.

9 Claims, 13 Drawing Sheets

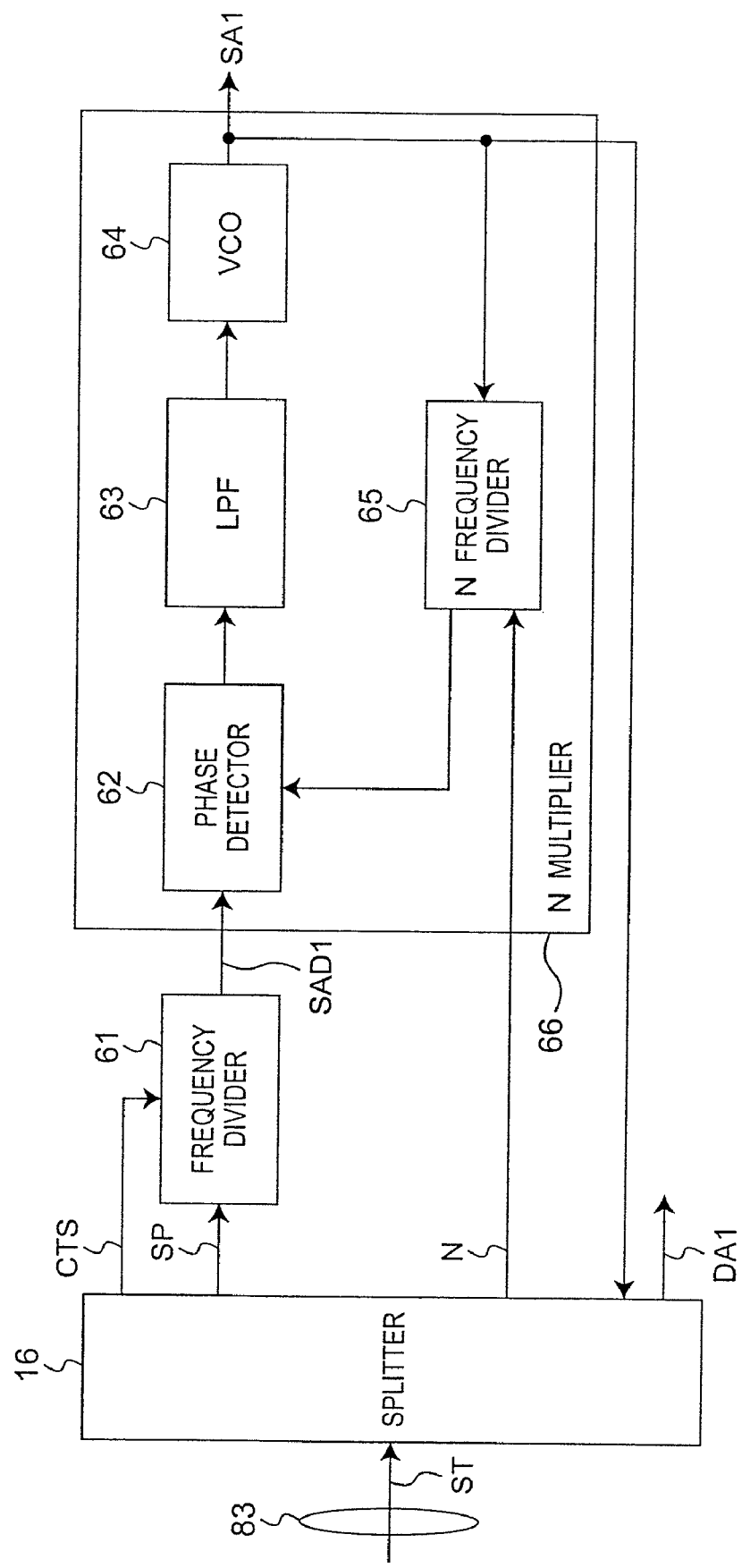

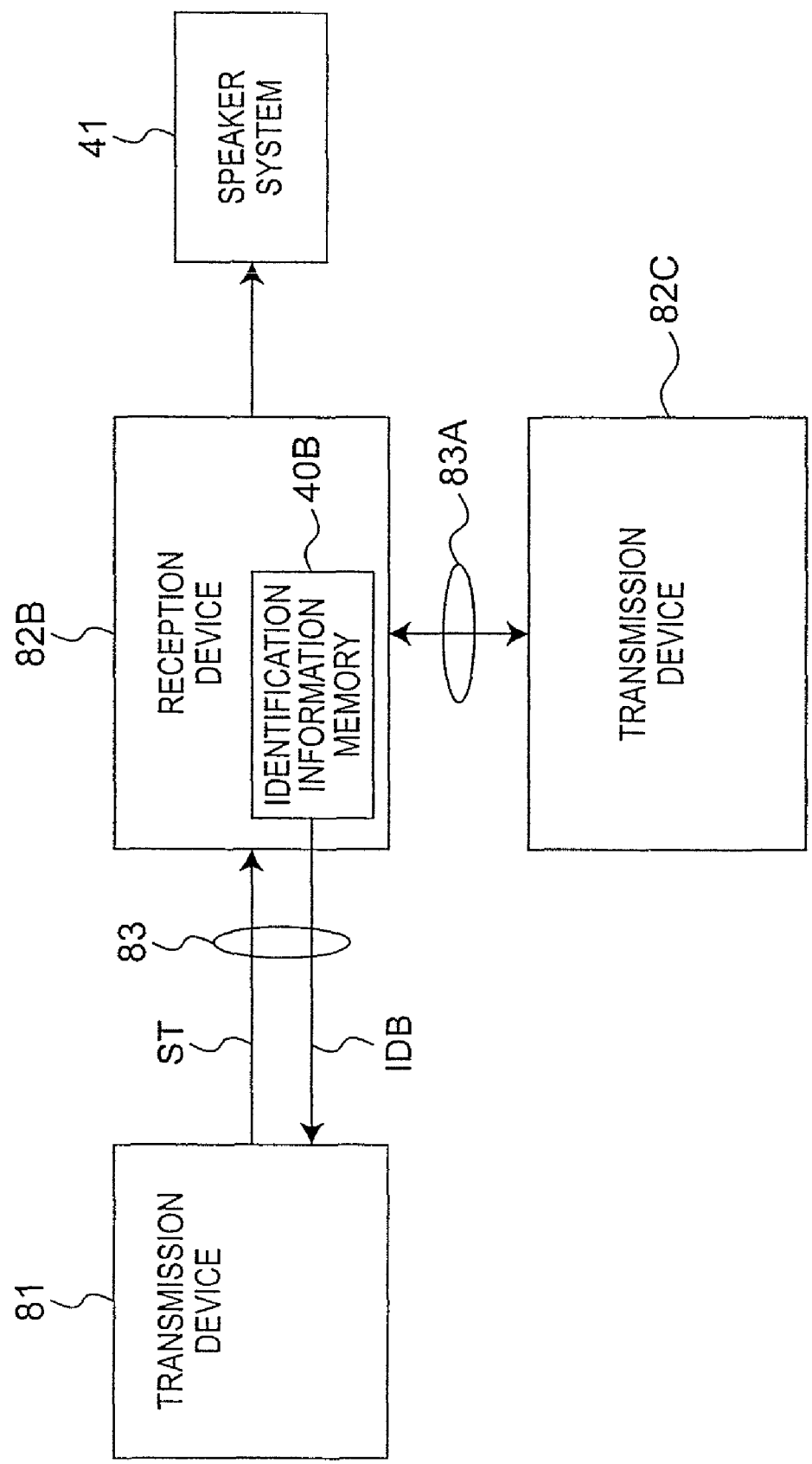

Fig.2A

| | FS = 48 (kHz) | | |
|---|---|---|---|
| FP (MHz) | N | CTS | FAD |
| 25.2/1.001 | 6864 | 28125 | 0.895 |
| 25.2 | 6144 | 25200 | 1.000 |
| 27 | 6144 | 27000 | 1.000 |
| 27*1.001 | 6144 | 27027 | 1.000 |
| 54 | 6144 | 64000 | 1.000 |
| 74.25/1.001 | 11648 | 140625 | 0.527 |
| 74.25 | 6144 | 74350 | 1.000 |
| 148.5/1.001 | 5824 | 140625 | 1.055 |
| 148.5 | 6144 | 148500 | 1.000 |

Fig.2B

| | FS = 48 (kHz) | | |
|---|---|---|---|
| FP (MHz) | N | CTS | FAD |
| 25.2/1.001 | 4096 | 16783.2167 | 1.500 |
| 25.2 | 4096 | 16800 | 1.500 |
| 27 | 4096 | 18000 | 1.500 |
| 27*1.001 | 4096 | 18018 | 1.500 |
| 54 | 4096 | 36000 | 1.500 |
| 74.25/1.001 | 4096 | 49450.5493 | 1.500 |
| 74.25 | 4096 | 49500 | 1.500 |
| 148.5/1.001 | 4096 | 98901.1 | 1.500 |
| 148.5 | 4096 | 99000 | 1.500 |

Fig.2C

| | FS = 44.1 (kHz) | | |
|---|---|---|---|
| FP (MHz) | N | CTS | FAD (kHz) |
| 25.2/1.001 | 7007 | 31250 | 0.806 |
| 25.2 | 6272 | 28000 | 0.900 |
| 27 | 6272 | 30000 | 0.900 |
| 27*1.001 | 6272 | 30030 | 0.900 |
| 54 | 6272 | 50000 | 0.900 |
| 74.25/1.001 | 17836 | 234375 | 0.316 |
| 74.25 | 6272 | 82500 | 0.900 |
| 148.5/1.001 | 8918 | 234375 | 0.633 |
| 148.5 | 6272 | 165000 | 0.900 |

Fig.2D

| | FS = 44.1 (kHz) | | |
|---|---|---|---|
| FP (MHz) | N | CTS | FAD (kHz) |
| 25.2/1.001 | 3764 | 16786.7845 | 1.500 |
| 25.2 | 3764 | 16803.5714 | 1.500 |
| 27 | 3764 | 18003.8265 | 1.500 |
| 27*1.001 | 3764 | 18021.8304 | 1.500 |
| 54 | 3764 | 36007.6531 | 1.500 |
| 74.25/1.001 | 3764 | 49461.0618 | 1.500 |
| 74.25 | 3764 | 49510.523 | 1.500 |
| 148.5/1.001 | 3764 | 98922.1249 | 1.500 |
| 148.5 | 3764 | 99021.0459 | 1.500 |

Fig. 2E

| FP (MHz) | FS = 96 (kHz) | | |
|---|---|---|---|
| | N | CTS | FAD (kHz) |
| 25.2/1.001 | 13728 | 28125 | 0.895 |
| 25.2 | 12288 | 25200 | 1.000 |
| 27 | 12288 | 27000 | 1.000 |
| 27*1.001 | 12288 | 27027 | 1.000 |
| 54 | 12288 | 54000 | 1.000 |
| 74.25/1.001 | 23296 | 140625 | 0.527 |
| 74.25 | 12288 | 74250 | 1.000 |
| 148.5/1.001 | 11648 | 140625 | 1.055 |
| 148.5 | 12288 | 148500 | 1.000 |

Fig. 2F

| FP (MHz) | FS = 96 (kHz) | | |
|---|---|---|---|
| | N | CTS | FAD (kHz) |
| 25.2/1.001 | 8192 | 16783.2167 | 1.500 |
| 25.2 | 8192 | 16800 | 1.500 |
| 27 | 8192 | 18000 | 1.500 |
| 27*1.001 | 8192 | 18018 | 1.500 |
| 54 | 8192 | 36000 | 1.500 |
| 74.25/1.001 | 8192 | 49450.5493 | 1.500 |
| 74.25 | 8192 | 49500 | 1.500 |
| 148.5/1.001 | 8192 | 98901.1 | 1.500 |
| 148.5 | 8192 | 99000 | 1.500 |

TRANSMISSION DEVICE

BACKGROUND OF THE INVENTION

1. Field of Invention

The present invention relates to a transmission device that conforms to the HDMI (High-Definition Multimedia Interface) that is used in Blu-ray/DVD (digital versatile disc) players and Blu-ray/DVD recorders for simultaneously transmitting digital video signals and digital audio signals.

2. Description of Related Art

Transmitters and receivers that conform to the HDMI specification are rapidly increasing in popularity as input/output interface devices for easily sending and receiving high-definition video signals and high-definition audio signals.

FIG. 4 is a block diagram of a transmission and reception system conforming to the HDMI specification, that is, that uses an HDMI interface. This transmission and reception system using a HDMI interface includes a transmission device 81p, an HDMI cable 83p, and a reception device 82p. The transmission device 81p digitally transmits digital video signals and digital audio signals to the reception device 82p over the HDMI cable 83p. A transmission device 81p according to the related art is taught in Japanese Laid-open Patent Publication No. 2004-23187.

FIG. 5 is a block diagram of a transmission section of an audio signal in a transmission device 81p according to the related art. As shown in FIG. 5 this transmission device 81p has a parameter value selection unit 13p, a frequency divider 11p, a counter 12p, a content signal generating unit 15p, and a physical layer format conversion unit 14p.

The parameter value selection unit 13p selects a specific parameter value from among a plurality of parameter values, and generates and outputs a selected parameter value Np representing the selected parameter value to the frequency divider 11p and content signal generating unit 15p.

Node TDAp receives the digital audio signal DAp, and node TDPp receives the digital video signal DPp.

Node TSAp receives audio clock SAp representing the master clock for processing the digital audio signal DAp.

Node TSPp receives the pixel clock SPp representing the master clock for processing the digital video signal DPp.

The frequency divider 11p frequency divides the audio clock SAp using the selected parameter value Np, and outputs frequency division signal SADp. If the frequency of the audio clock SAp (that is, the audio clock frequency) is FAp, the frequency of the frequency division signal SADp (that is, the frequency division signal frequency) FADp is shown by the following expression.

$$FADp = FAp/Np$$

The counter 12p counts each cycle of the frequency division signal SADp at the pixel clock SPp, generates the cycle time stamp CTSp representing the resulting count, and outputs to the content signal generating unit 15p. If the frequency of the pixel clock SPp (that is, the pixel clock frequency) is FPp, the cycle time stamp CTSp is shown by the following expression.

$$CTSp = FPp/FADp$$

The content signal generating unit 15p includes buffer memory not shown. The content signal generating unit 15p compresses the time base by writing the digital audio signal DAp, selected parameter value Np, and cycle time stamp CTSp at the audio clock SAp to buffer memory, and then reading at the pixel clock SPp. The content signal generating unit 15p packetizes and inserts the time-base-compressed digital audio signal DAp, selected parameter value Np, and cycle time stamp CTSp to the blanking period of the digital video signal DPp. The content signal generating unit 15p thus produces a content signal SCp representing the inserted signal, and outputs to the physical layer format conversion unit 14p.

The physical layer format conversion unit 14p converts the content signal SCp and pixel clock SPp to the physical layer format of the TMDS (Transition-Minimized Differential Signaling) specification to produce and output a physical layer conversion signal STp representing the converted signal to the reception device 82p. The transmission device 81p thus does not send the audio clock SAp directly to the reception device 82p, and instead sends the cycle time stamp CTSp and selected parameter value Np representing information about the audio clock SAp relative to the pixel clock SPp to the reception device 82p. The reception device 82p then generates the audio clock SAp based on the pixel clock SPp, selected parameter value Np, and cycle time stamp CTSp.

If the sampling frequency of the digital audio signal DAp (that is, the audio sampling frequency) is FSp, the audio clock frequency FAp is shown by the following expression.

$$FAp = 128 * FSp$$

FIG. 6 is a block diagram showing a part of the reception device 82p. The reception device 82p receives the pixel clock SPp, selected parameter value Np, and cycle time stamp CTSp from the transmission device 81p over the HDMI cable 83p, and outputs the playback audio clock SA1p.

Based on the received cycle time stamp CTSp, the frequency divider 61p generates a playback frequency division signal SAD1p, which is the pixel clock SPp frequency divided using the cycle time stamp CTSp. The frequency of the playback frequency division signal SAD1p (that is, the playback frequency division signal frequency) FAD1p is shown by the following expression using the pixel clock frequency FPp.

$$FAD1p = FPp/CTSp$$

The N multiplier 66p is a PLL (Phase Locked Loop), and includes a phase detector 62p, LPF (low pass filter) 63p, VCO (variable phase oscillator) 64p, and N frequency divider 65p.

The N multiplier 66p multiplies the playback frequency division signal SAD1p Np times, and outputs the playback audio clock SA1p. If the sampling frequency of the reproduced digital audio signal DAp (that is, the playback audio-sampling frequency) is FS1p, the frequency FA1p of the playback audio clock SA1p (that is, the playback audio clock frequency) is shown by the following expression.

$$FA1p = FAD1p * Np$$
$$= 128 * Fs1p$$

As described in Design Wave Magazine (pp. 73-81, April 2008, CQ Shuppansha), the selected parameter value Np is greater than or equal to FA/1500 Hz and is less than or equal to FA/300 Hz as shown by the following expression.

$$(FAp/1500 \text{ Hz}) \leq Np \leq (FAp/300 \text{ Hz})$$

Within the range of the selected parameter value Np, if the audio sampling frequency FSp is 48 kHz, for example, the recommended selected parameter value Np is Np=(FAp/1000 Hz), and if the audio sampling frequency FSp is 44.1 kHz, the recommended selected parameter value Np is Np=(FAp/900 Hz).

The related art described above cannot, however, achieve sufficiently high performance audio quality. A transmission and reception system using the HDMI interface suffers from inferior sound quality compared with the IEC60958 specification, for example. As described above, the recommended selected parameter value Np is Np=(FAp/1000 Hz) when the sampling frequency is 48 kHz, and is Np=(FAp/900 Hz) when the sampling frequency is 44.1 kHz. These recommended values are premised on no change in the cycle time stamp CTSp over time.

In an actual transmission device 81$p$, however, the audio clock SAp and pixel clock SPp are generated based on two different reference clock generators (such as crystal oscillators). In such a configuration the frequency and phase of both clocks are independent of each other, and vary over time with differences in the temperature characteristics of the crystal oscillators. As a result, the cycle time stamp CTSp that is produced based on the audio clock SAp and pixel clock SPp varies over time. The playback frequency division signal frequency FAD1$p$ therefore also varies over time. As a result, variation in the playback audio clock frequency FA1$p$ is multiplied Np times by the N multiplier 66$p$, and thus varies even more greatly over time.

SUMMARY OF THE INVENTION

The present invention is directed to solving the foregoing problem by rendering a transmission device that improves sound quality in a transmission and reception system using the HDMI interface.

To achieve the foregoing object, a transmission device according to the present invention is operable to transmit a first clock to a reception device. The transmission device includes: a first reception arrangement operable to receive the first clock; a second reception arrangement operable to receive a second clock; a selection arrangement operable to select any of plural parameters, each of the parameters representing a degree of lowering a frequency of the second clock; a frequency lowering arrangement operable to lower the frequency of the received second clock based on the parameter selected by the selection arrangement to produce a third clock; a correlation detecting arrangement operable to detect a correlation between the received first clock and the produced third clock; a transmission arrangement operable to transmit the first clock, the parameter, and a correlation information to the reception device, the parameter selected by the selection arrangement and the correlation information representing the correlation detected by the correlation detecting arrangement; and an information acquisition arrangement operable to acquire an allowable range information from the reception device, the allowable range information representing an allowable range of the parameter when the reception device produces a similar clock to the second clock; wherein the reception device receives the first clock, the parameter, and the correlation information from the transmission arrangement to produce the similar clock to the second clock based on the first clock, the parameter, and the correlation information, and the selection arrangement selects any of the plural parameters, the each of the parameters representing the degree of lowering the frequency of the second clock based on the allowable range information being acquired.

The identification information processing unit and parameter value selection unit of a transmission device according to the present invention selects a second parameter value as the selected parameter value when the reception device is a high quality audio device, thereby reducing variation in the playback audio clock frequency of the reception device and improving the variation characteristic. As a result, the transmission device 81 of the present invention can improve sound quality in a transmission and reception system using an HDMI interface.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1B is a block diagram showing the configuration of a part of the reception device.

FIG. 1E is a block diagram showing the relationship between the transmission devices and reception device based on the EDID specification.

FIG. 2A shows the relationship between selected parameters and frequencies.

FIG. 2B shows the relationship between selected parameters and frequencies.

FIG. 2C shows the relationship between selected parameters and frequencies.

FIG. 2D shows the relationship between selected parameters and frequencies.

FIG. 2E shows the relationship between selected parameters and frequencies.

FIG. 2F shows the relationship between selected parameters and frequencies.

KEY TO THE FIGURES

Figure 1A:
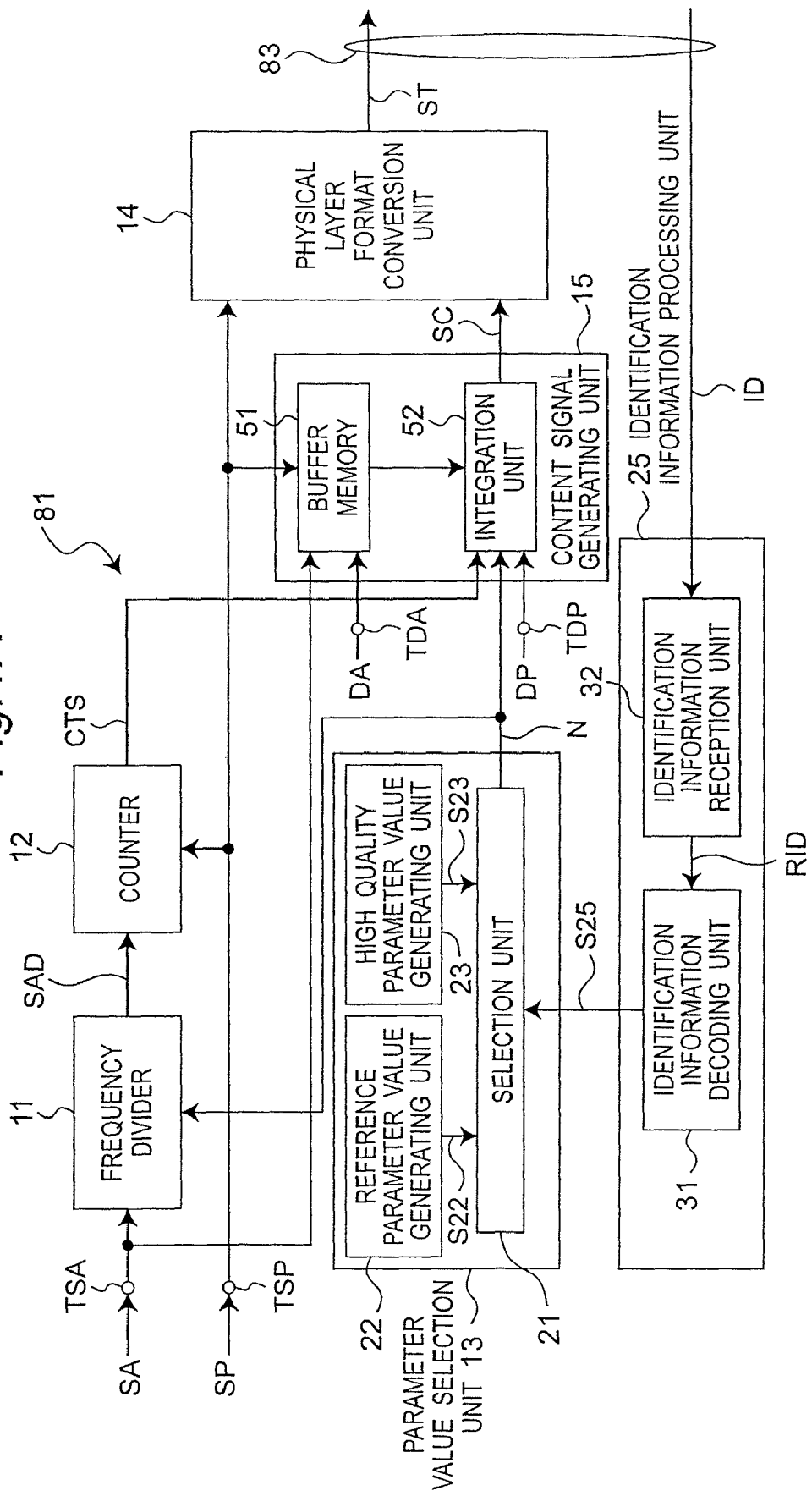
FIG. 1A is a block diagram showing the configuration of a transmission device according to one embodiment of the invention.

11, 61 frequency divider
12 counter
13 parameter value selection unit
14 physical layer format conversion unit
15 content signal generating unit
16 splitter
21 selection unit
22 reference parameter value generating unit
23 high quality parameter value generating unit
25 identification information processing unit
31 identification information decoding unit
32 identification information reception unit
40, 40A, 40B identification information memory
41 speaker system
51 buffer memory
52 integration unit 62 phase detector
63 LPF
64 VCO
65 N frequency divider
66 N multiplier
81 transmission device
82, 82A, 82B, 82C reception device
83, 83A HDMI cable

DETAILED DESCRIPTION OF THE PREFERRED EMBODIMENTS

Some preferred embodiments of the invention are described below with reference to the accompanying figures wherein parts having the same arrangement, operation, and effect are denoted by the same reference numbers. Numbers used in the following description are by way of example only to describe the invention clearly, and the invention is not limited to these numbers in any way. Logic levels expressed as high and low, and switching states expressed as on and off, are also used by way of example only to describe a specific embodiment of the invention, and it will be obvious that the same effect can be achieved using different combinations of logic levels and switching states. Connections between specific elements and components are also shown by way of example only, and the connections achieving the function of the invention are not so limited. The following embodiments are also rendered using hardware and/or software components, but the hardware configurations can be achieved using software and the software configurations can be achieved using hardware.

Figure 1C:
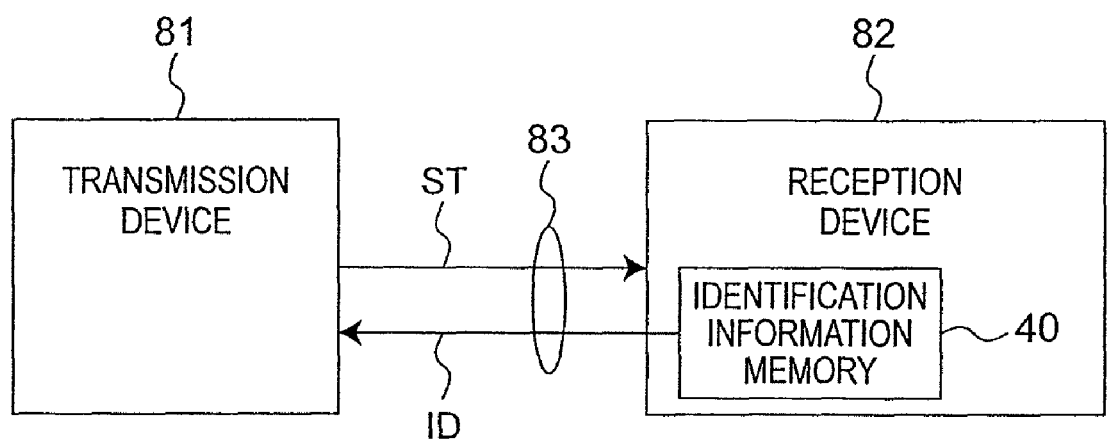
FIG. 1C is a block diagram showing the configuration of a transmission and reception system.

FIG. 1C is a block diagram of a transmission and reception system conforming to the HDMI specification, that is, that uses an HDMI interface. This transmission and reception system using a HDMI interface includes a transmission device 81, an HDMI cable 83, and a reception device 82. The transmission device 81 digitally transmits digital video signals and digital audio signals to the reception device 82 over the HDMI cable 83.

FIG. 1A is a block diagram of showing the configuration of the transmission device 81. As shown in FIG. 1A this transmission device 81 has a parameter value selection unit 13, a frequency divider 11, a counter 12, a content signal generating unit 15, a physical layer format conversion unit 14, and an identification information processing unit 25.

The parameter value selection unit 13 selects a specific parameter value from among a plurality of parameter values, and generates and outputs a selected parameter value N representing the selected parameter value to the frequency divider 11 and content signal generating unit 15.

Node TDA receives the digital audio signal DA, and node TDP receives the digital video signal DP.

Node TSA receives audio clock SA representing the master clock for processing the digital audio signal DA.

Node TSP receives the pixel clock SP representing the master clock for processing the digital video signal DP.

The frequency divider 11 frequency divides the audio clock SA using the selected parameter value N, and outputs frequency division signal SAD. If the frequency of the audio clock SA (that is, the audio clock frequency) is FA, the frequency of the frequency division signal SAD (that is, the frequency division signal frequency) FAD is shown by the following expression (1).

$$FAD = FA/N \quad (1)$$

The counter 12 counts each cycle of the frequency division signal SAD at the pixel clock SP, generates the cycle time stamp CTS representing the resulting count, and outputs to the content signal generating unit 15. If the frequency of the pixel clock SP (that is, the pixel clock frequency) is FP, the cycle time stamp CTS is shown by the following expression (2).

$$CTS = FP/FAD \quad (2)$$

The content signal generating unit 15 includes a buffer memory 51 and an integration unit 52. The content signal generating unit 15 compresses the time base by writing the digital audio signal DA at the audio clock SA to the buffer memory 51, and then reading at the pixel clock SP. The integration unit 52 packetizes and inserts the time-base-compressed digital audio signal, selected parameter value N, and cycle time stamp CTS to the blanking period of the digital video signal DP. The content signal generating unit 15 thus produces a content signal SC representing the inserted signal, and outputs to the physical layer format conversion unit 14.

The physical layer format conversion unit 14 converts the content signal SC and pixel clock SP to the physical layer format of the TMDS (Transition-Minimized Differential Signaling) specification to produce and output a physical layer conversion signal ST representing the converted signal to the reception device 82. The transmission device 81 thus does not send the audio clock SA directly to the reception device 82, and instead sends the cycle time stamp CTS and selected parameter value N denoting information about the audio clock SA relative to the pixel clock SP to the reception device 82. The reception device 82 then generates the audio clock SA based on the pixel clock SP, selected parameter value N, and cycle time stamp CTS.

If the sampling frequency of the digital audio signal DA (that is, the audio sampling frequency) is FS, the audio clock frequency FA is shown by the following expression (3).

$$FA = 128 * FS \quad (3)$$

FIG. 1B is a block diagram showing the part of the reception device 82 that receives the physical layer conversion signal ST from the transmission device 81 over the HDMI cable 83 and generates the reproduced audio clock, that is, playback audio clock SA1.

Based on the received physical layer conversion signal ST, the splitter 16 generates the pixel clock SP, selected parameter value N, cycle time stamp CTS, and digital audio playback signal DA1 (the reproduced digital audio signal). The function of the splitter 16 is the opposite of the function of the content signal generating unit 15 and physical layer format conversion unit 14 described above.

More specifically, the splitter 16 generates the content signal SC and pixel clock SP based on the physical layer conversion signal ST having the physical layer format of the TMDS specification.

In addition, the splitter 16 extracts the time-base compressed digital audio signal, selected parameter value N, and cycle time stamp CTS from the blanking period of the digital video signal DP based on the content signal SC and pixel clock SP.

Based on the extracted cycle time stamp CTS, the frequency divider also generates the playback frequency division signal SAD1 representing the pixel clock SP frequency divided using the cycle time stamp CTS.

The frequency FAD1 of the playback frequency division signal SAD1 (that is, the playback frequency division signal frequency) is described by expression (4) using the pixel clock frequency FP.

$$FAD1 = FP/CTS \quad (4)$$

The N multiplier 66 is a PLL (Phase Locked Loop), and includes a phase detector 62, LPF (low pass filter) 63, VCO (variable phase oscillator) 64, and N frequency divider 65.

The N multiplier 66 multiplies the playback frequency division signal SAD1 N times, and outputs the playback audio clock SA1. The frequency FA1 of the playback audio clock SA1 (that is, the playback audio clock frequency) is shown by the following expression (5).

$$FA1 = FAD1 * N \quad (5)$$

The splitter 16 has a buffer memory (not shown in the figures). The splitter 16 writes the time-base compressed digital audio signal extracted from the blanking period of the digital video signal DP to buffer memory at the pixel clock SP, and reads at the playback audio clock SA1. As a result, the splitter 16 expands the time base of the time-base compressed digital audio signal, and outputs the digital audio playback signal DA1.

If the sampling frequency of the digital audio playback signal DA1 (that is, the reproduced audio sampling frequency) is FS1, the frequency FA1 of the playback audio clock SA1 (that is, the reproduced audio clock frequency) is as shown in expression (5) and expression (6)

$$FA1 = 128 * FS1 \quad (6)$$

As shown in expression (7), the selected parameter value N is greater than or equal to FA/1500 Hz and is less than or equal to FA/1200 Hz in this embodiment of the invention. Using expression (1), expression 7 can be rewritten as shown in expression (8).

$$(FA/1500 \text{ Hz}) \leq N \leq (FA/1200 \text{ Hz}) \quad (7)$$

$$1200 \text{ Hz} \leq FAD \leq 1500 \text{ Hz} \quad (8)$$

FIG. 2A, FIG. 2B, FIG. 2C, FIG. 2D, FIG. 2E, and FIG. 2F show different possible settings for nine different pixel clock frequencies FP. These examples show the settings for the selected parameter value N, cycle time stamp CTS, and frequency division signal frequency FAD.

In FIG. 2A the first of the nine configurations is for a pixel clock frequency FP of 25.2/1.001 MHz, and has a selected parameter value N of 6864, a cycle time stamp CTS of 28125, and a frequency division signal frequency FAD of 0.895 kHz. The remaining eight samples in FIG. 2A and the samples in FIG. 2A to FIG. 2F can be read in the same way.

FIG. 2A and FIG. 2B show sample settings for an audio sampling frequency FS of 48 kHz. FIG. 2C and FIG. 2D show sample settings for an audio sampling frequency FS of 44.1 kHz. FIG. 2E and FIG. 2F show sample settings for an audio sampling frequency FS of 96 kHz. FIG. 2A to FIG. 2F thus show nine sample pixel clock frequencies FP for three different audio sampling frequencies FS (FIG. 2A, FIG. 2B; FIG. 2C, FIG. 2D; FIG. 2E, FIG. 2F). As a result, FIG. 2A to FIG. 2F show 3×9=27 settings based on the different audio sampling frequency FS and pixel clock frequency FP settings.

Some of the pixel clock frequencies FP are shown multiplied by a coefficient of 1.001 or divided by a coefficient of 1.001. Some of the cycle time stamps CTS include a decimal portion. However, the cycle time stamp CTS is actually an integer value, and an operation to obtain a real number value is applied based on the integer-value cycle time stamp CTS. For example, the real numbers recorded in these tables can be obtained using a predetermined ratio between the two integers bracketing each real number value containing a decimal portion. For example, a cycle time stamp CTS of 98901.1 can be achieved by generating 98901 and 98902 at a ratio of 9:1.

The values shown in FIG. 2A to FIG. 2F can also be calculated precisely using expressions (1) to (3).

FIG. 2A, FIG. 2C, and FIG. 2E show sample values when expression (7) and expression (8) are not true, that is, when the first parameter value (described below) is used, and FIG. 2B, FIG. 2D, and FIG. 2F show sample values when expression (7) and expression (8) are true, that is, when the second parameter value that is smaller than the first parameter value (described below) is used.

The relationship between the values shown in FIG. 2A, FIG. 2C, and FIG. 2E is referred to below as the reference setting group, and the relationship between the values shown in FIG. 2B, FIG. 2D, and FIG. 2F is referred to as the high quality settings group.

Referring to expression (8), the frequency division signal frequency FAD is less than 1100 Hz in the reference setting group but is 1500 Hz in the high quality setting group.

With expression (7), the selected parameter value N in FIG. 2B is less than the selected parameter value N in FIG. 2A when the audio sampling frequency FS is 48 kHz. When the audio sampling frequency FS is 44.1 kHz, the selected parameter value N in FIG. 2D is less than the selected parameter value N in FIG. 2C. When the audio sampling frequency FS is 96 kHz, the selected parameter value N in FIG. 2F is less than the selected parameter value N in FIG. 2E. Therefore, the selected parameter value N in the high quality setting group is less than the selected parameter value N in the reference setting group in the 27 different audio sampling frequency FS and pixel clock frequency FP combinations described above.

What happens when the audio clock SA and pixel clock SP are produced using two different reference clock oscillators (such as crystal oscillators) is described next with reference to FIG. 1A, FIG. 1B, FIG. 3A, and FIG. 3B.

Due to differences in the temperature characteristics of the crystal oscillators, the frequency and phase of the audio clock SA and pixel clock SP will each vary independently of the other clock. As a result, the value of the cycle time stamp CTS will also vary over time. This is because the cycle time stamp CTS is produced based on the audio clock SA and pixel clock SP by the frequency divider 11 and counter 12 in FIG. 1A.

If the oscillation frequency of the crystal oscillator is fr, and dr is the variation in the oscillation frequency of the crystal oscillator based on the temperature characteristic of the oscillation device in the crystal oscillator, the ratio dr/fr therebetween will be a predetermined value. Therefore, the variation in the frequency of the audio clock SA to the level of the audio clock frequency FA (or audio sampling frequency FS) will also be a predetermined ratio. In addition, the variation in the frequency of the pixel clock SP to the level of the pixel clock frequency FP will be a predetermined ratio. As a result, the variation in the cycle time stamp CTS will be a specific value in each of the 27 different combinations of settings based on the audio sampling frequency FS and pixel clock frequency FP.

The frequency divider 61 in FIG. 1B generates the playback frequency division signal SAD1 based on the cycle time stamp CTS and pixel clock SP. Because the cycle time stamp CTS varies with time as described above, the playback frequency division signal SAD1 also varies with time. Variation in the frequency and/or phase of a signal with time is also called jitter. The variation in the playback frequency division signal frequency FAD1 (that is, the amount of jitter) is a specific value in each of the 27 combinations of audio sampling frequency FS and pixel clock frequency FP described above.

Figure 3A:
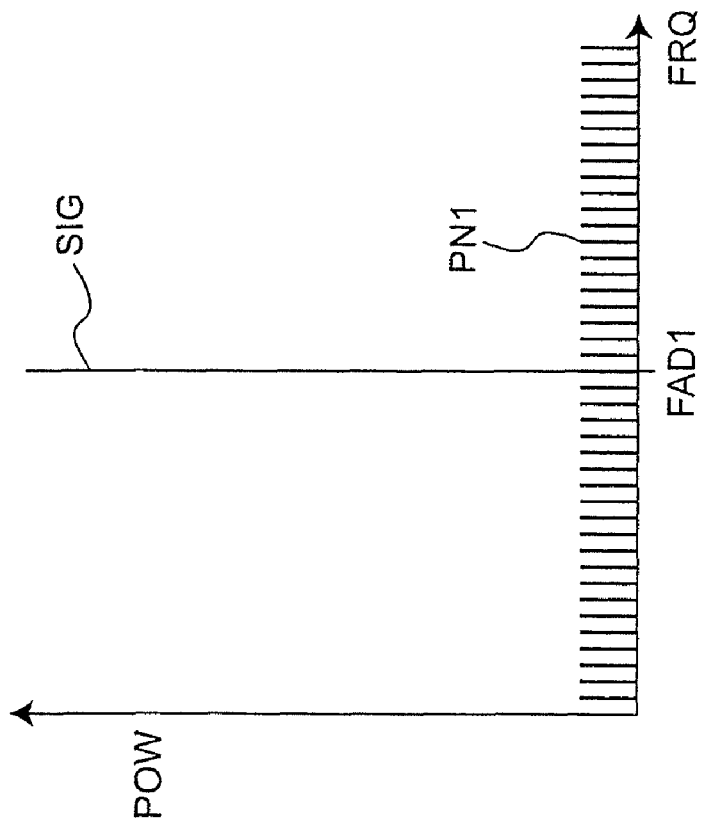
FIG. 3A describes the operation of the reception device.

FIG. 3A shows the reference signal spectrum SIG (where the frequency is equal to playback frequency division signal frequency FAD1) and noise spectrum PN1 for the playback frequency division signal SAD1.

Figure 3B:
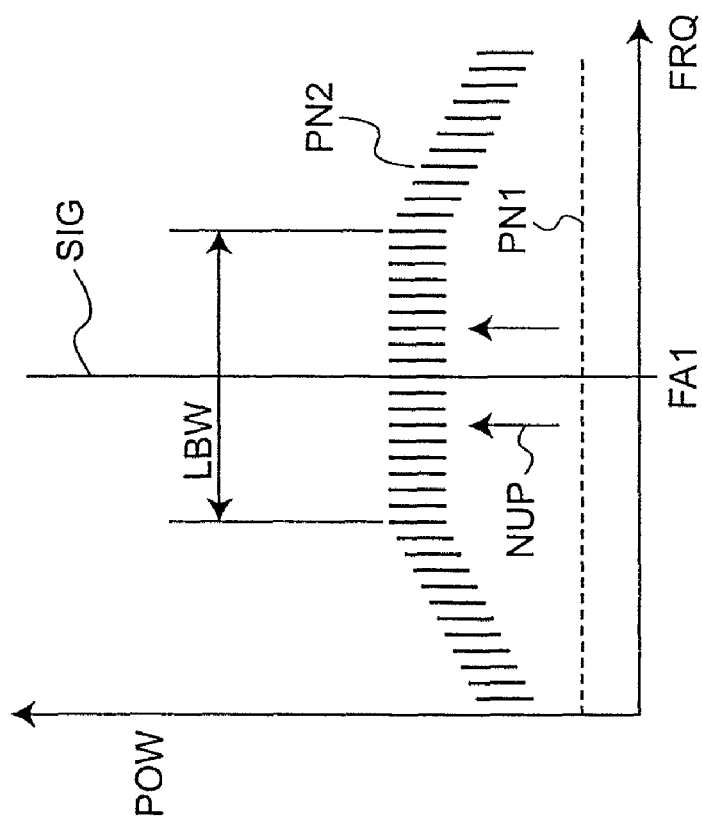
FIG. 3B describes the operation of the reception device.
Figure 4:
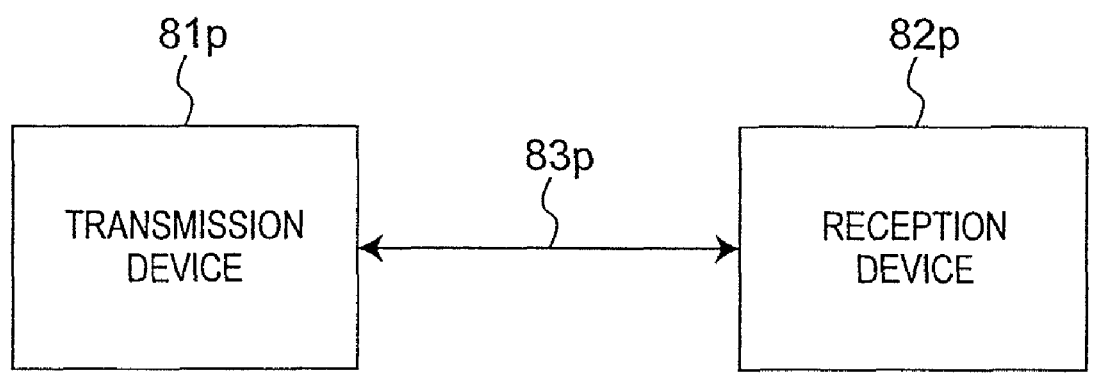
FIG. 4 is a block diagram showing the configuration of a transmission and reception system according to the related art.
Figure 5:
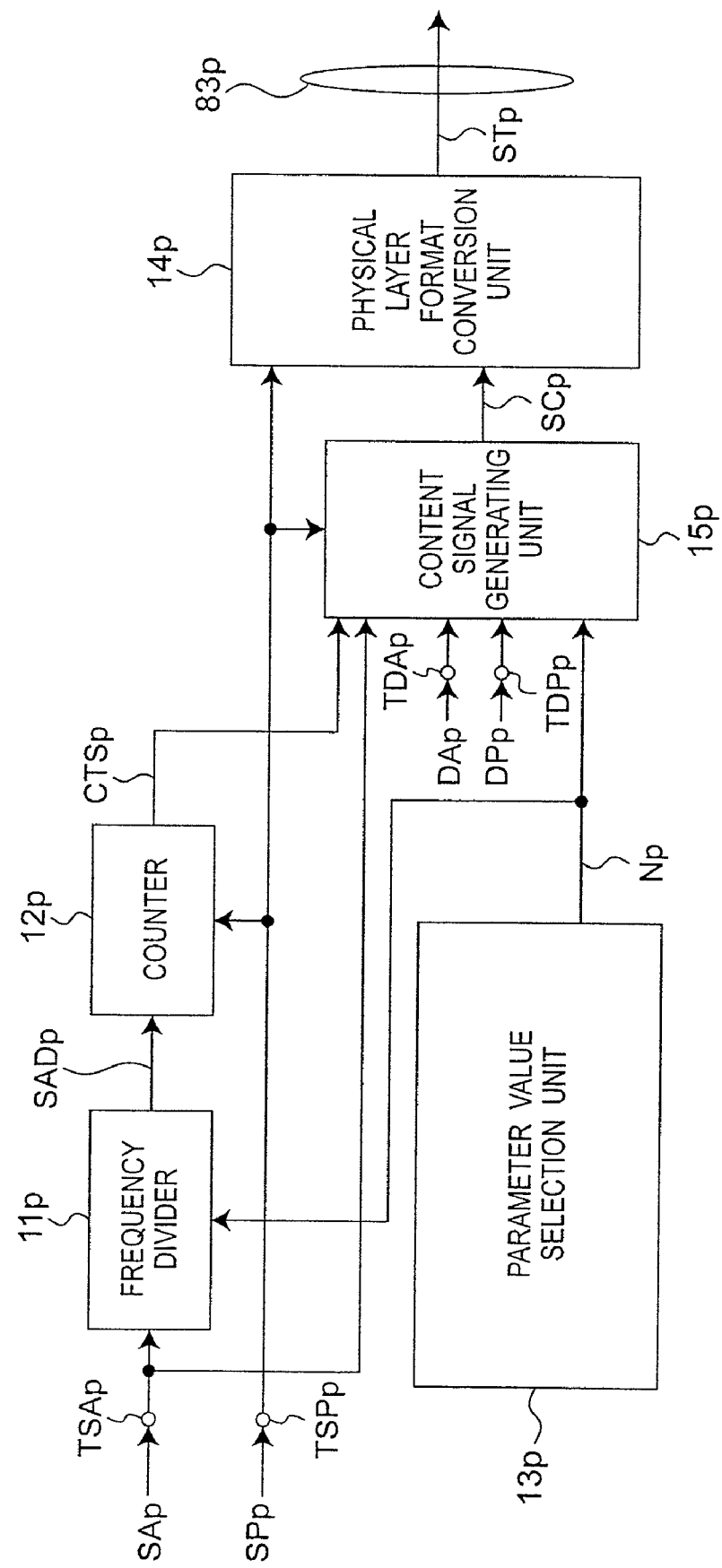
FIG. 5 is a block diagram showing the configuration of the transmission devices according to the related art.
Figure 6:
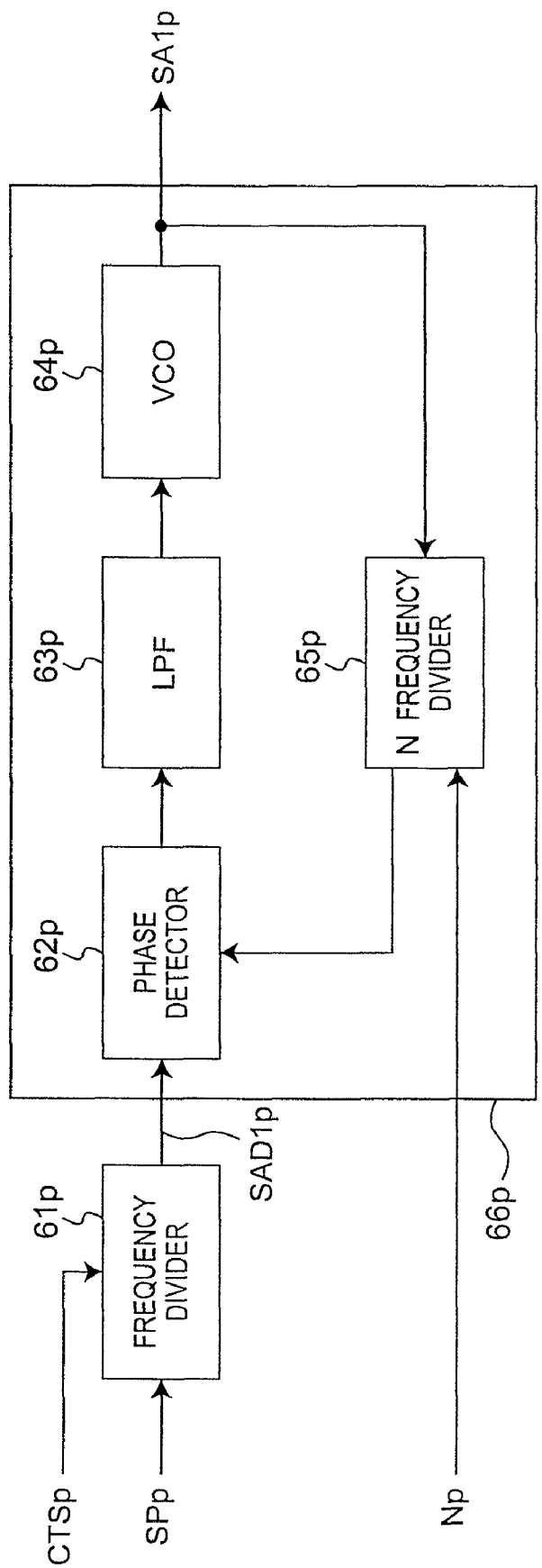
FIG. 6 is a block diagram showing the configuration of a part of the reception device according to the related art.

FIG. 3B shows reference signal spectrum SIG (where the frequency is equal to playback audio clock frequency FA1) and noise spectrum PN2 for the playback audio clock SA1 (FIG. 1B).

The y-axis shows the power POW and the x-axis shows the frequency FRQ in both figures, and the reference signal spectrum SIG level is adjusted to the same level in both figures. The loop bandwidth LBW indicates the loop bandwidth of the PLL circuit of the N multiplier 66 (FIG. 1B).

In this case the power level of the noise spectrum PN1 of the playback frequency division signal SAD1 increases N times as indicated by NUP in the loop bandwidth LBW (FIG. 3B).

More specifically, the variation in the playback audio clock frequency FA1 (jitter) is made N times greater than the variation in the playback frequency division signal frequency FAD1 by the PLL circuit of the N multiplier 66. This can be explained by differentiating the playback audio clock frequency FA1 and playback frequency division signal frequency FAD1 in expression (5). Similarly to the playback frequency division signal SAD1, the variation in the playback audio clock frequency FA1 is also a specific value in each of the 27 audio sampling frequency FS and pixel clock frequency FP combinations.

However, in the sample settings for the 27 audio sampling frequency FS and pixel clock frequency FP combinations described above, the selected parameter value N in the high quality setting group is lower than the selected parameter value N in the reference setting group. In addition, in the 27 different combinations described above, the variation of the playback audio clock frequency FA1 in the high quality setting group satisfying expression (7) and expression (8) can be made smaller than in the reference setting group substantially proportionally to the value of selected parameter value N.

In addition, jitter in the digital audio playback signal DA1 (FIG. 1B) is equal to the jitter in the playback audio clock frequency FA1.

Therefore, jitter in the digital audio playback signal DA1 can be reduced by the parameter value selection unit 13 selecting a selected parameter value N in the high quality setting group.

The parameter value selection unit 13 includes a reference parameter value generating unit 22, high quality parameter value generating unit 23, and selection unit 21.

The reference parameter value generating unit 22 produces a specific reference parameter value (an example of a first parameter value) S22.

The high quality parameter value generating unit 23 produces a specific high quality parameter value (an example of a second parameter value) S23.

The selection unit 21 selects either the reference parameter value S22 or high quality parameter value S23 based on a decoded identification information S25 from the identification information processing unit 25, and generates the selected parameter value N representing the selected parameter value.

The reference parameter value S22 is, for example, a selected parameter value N in the reference setting group.

The high quality parameter value S23 is, for example, a selected parameter value N in the high quality setting group.

As described above, the high quality parameter value S23 is less than the reference parameter value S22 at each audio sampling frequency FS.

The identification information processing unit 25 controls the selection unit 21 using the decoded identification information S25. For example, if the reception device 82 is a television, the identification information processing unit 25 causes the selection unit 21 to select reference parameter value S22. If the reception device 82 is an audio device, it causes the selection unit 21 to select the high quality parameter value S23.

The audio device is, for example, a high quality audio device that can process a high quality digital audio signal DA. A high quality audio device outputs audio with higher sound quality than the audio output of a television. An AV amplifier (audio/video amplifier) is an example of a high quality audio device.

As shown in FIG. 1C the reception device 82 receives the physical layer conversion signal ST from the transmission device 81 over the HDMI cable 83. The reception device 82 is, for example, a television or a high quality audio device. The reception device 82 includes an identification information memory 40. The identification information memory 40 stores the identification information ID identifying the reception device 82.

The identification information ID conforms to the EDID (Extended Display Identification Data) specification, and includes at least one of the following: information about the number of audio channels in the reception device 82, information about the audio sampling frequency in the reception device 82, and information about the audio encoding scheme in the reception device 82.

The identification information ID is information representing the classification of the reception device 82. The reception device 82 can be identified by the identification information ID as a television or an audio device, for example. The identification information ID is used by the transmission device 81 and reception device 82 for authentication.

As shown in FIG. 1A the identification information processing unit 25 includes an identification information reception unit 32 and identification information decoding unit 31.

The identification information reception unit 32 receives identification information ID from the identification information memory 40 over the Display Data Channel (DDC) of the HDMI cable 83, and generates reception identification information RID. The reception identification information RID and the identification information ID differ in electrical format only, and the reception identification information RID contains all of the identification information ID information.

Figure 1D:
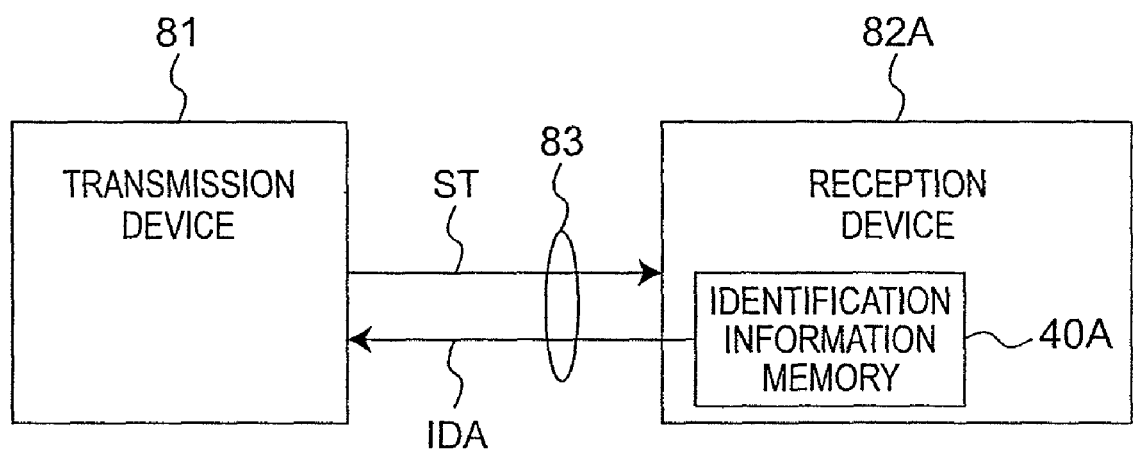
FIG. 1D is a block diagram showing the relationship between the transmission devices and reception device based on the EDID specification.

FIG. 1D and FIG. 1E are block diagrams showing the relationship between the transmission device 81 and reception device 82 based on the EDID specification. In FIG. 1D the reception device 82A is a television, and receives the physical layer conversion signal ST from the transmission device 81 over the HDMI cable 83. The reception device 82A also includes identification information memory 40A, and the identification information memory 40A stores the identification information IDA identifying the reception device 82A (that is, television 82A). The transmission device 81 receives the identification information IDA from the identification information memory 40A through the HDMI cable 83.

In FIG. 1E the reception device 82B is a high quality audio device. This reception device 82B receives the physical layer conversion signal ST from the transmission device 81 over the HDMI cable 83. This reception device 82B also has identification information memory 40B, and this identification information memory 40B stores the identification information IDB identifying the reception device 82B (that is, high quality audio device 82B). The transmission device 81 receives the identification information IDB from the identification information memory 40B through the HDMI cable 83.

The reception device 82B is connected through the HDMI cable 83A to the reception device 82C, which is a television, and through a desired audio cable to a speaker system 41. In this configuration the audio output of the television 82C is disabled, and the audio output of the high quality audio device 82B is enabled instead. As a result, the audio output of the high quality audio device 82B from the speaker system 41 is linked to the video output of the television 82C, providing higher quality audio output that the television 82C.

The identification information reception unit 32 of the transmission device 81 receives identification information ID including information identifying the television 82A or high quality audio device 82B, and outputs the reception identification information RID. The identification information decoding unit 31 decodes the reception identification information RID, and outputs decoded identification information S25 for the identification information.

Figure 1F:
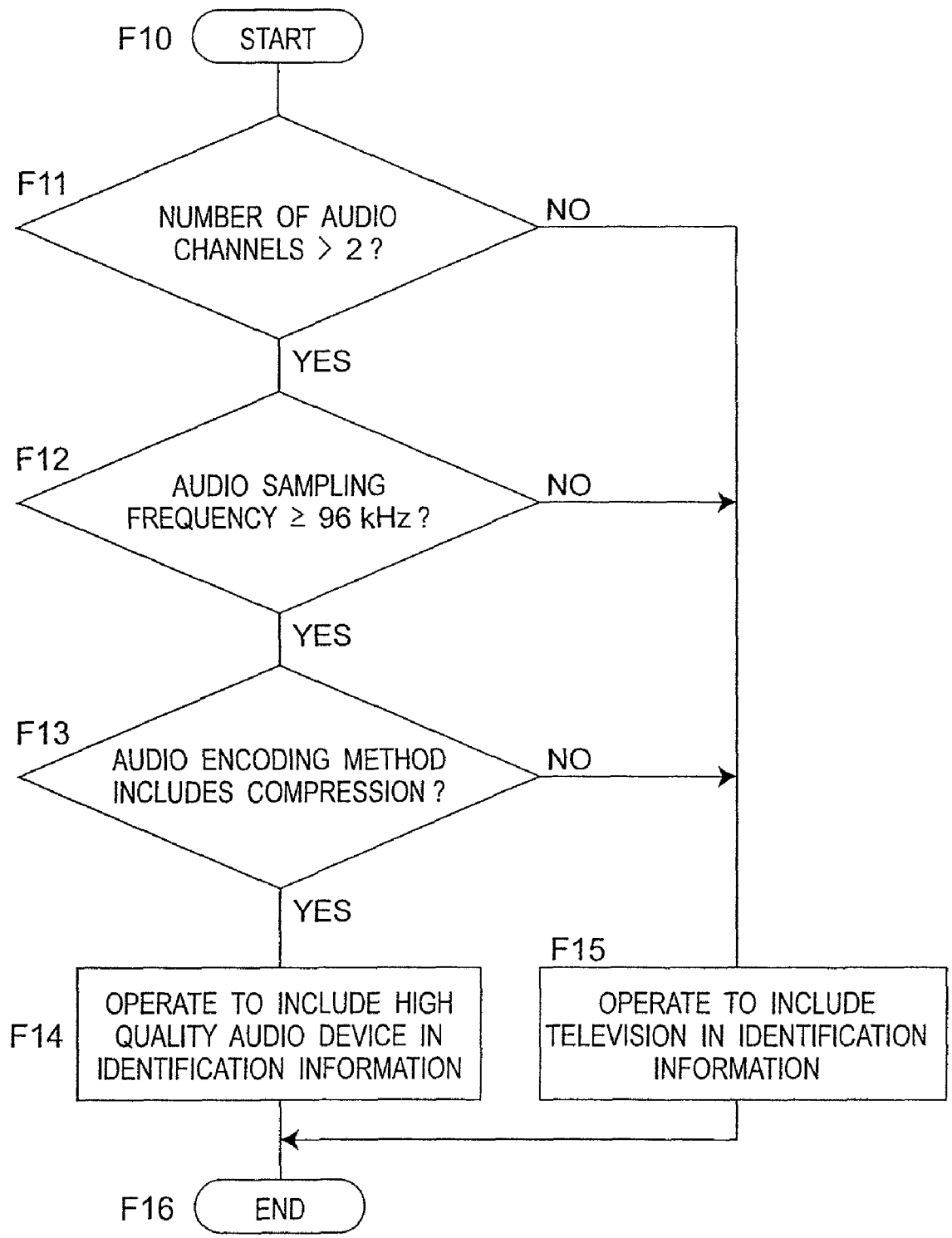
FIG. 1F is a flow chart describing the operation of the identification information decoding unit in the embodiment of the invention.

FIG. 1F is a flow chart describing the decoding operation of the identification information decoding unit 31.

The identification information decoding unit 31 starts operating in step F10, and in step F11 the identification information decoding unit 31 determines if the value of the audio channel count contained in the reception identification information RID is greater than a specific channel count, such as whether it is greater than two channels in this example. If it is greater than two channels, control goes to step F12. If it is less than or equal to two channels, control goes to step F15. One example of a high quality audio device 82B has six channels including two (left and right) front channels, two (left and right) surround channels, a center channel, and a subwoofer channel.

In step F12, the identification information decoding unit 31 determines if the audio sampling frequency contained in the reception identification information RID is greater than or equal to a desired value, such as whether it is greater than or equal to 96 kHz. If it is greater than or equal to 96 kHz, control goes to step F13. If less than 96 kHz, control goes to step F15. The high quality audio device 82B here has an audio sampling frequency that is greater than or equal to 96 kHz.

In step F13, the identification information decoding unit 31 determines if the audio encoding scheme contained in the reception identification information RID is a compression scheme, for example. If it includes a compression scheme, control goes to step F14. Control goes to step F15 only if the audio is encoded by linear PCM (Linear Pulse Code Modulation), which is a non-compression scheme. The high quality audio device 82B has a compressed audio decoding function for digital audio compression schemes such as AC3 (Audio Code number 3) and DTS (Digital Theater Systems).

In the method shown in FIG. 1F operation proceeds in the sequence step F11, step F12, and step F13. The processing sequence of steps F11, F12, F13 is not limited to the order shown in FIG. 1F, however, and steps F11, F12, and F13 can be executed in any of the six possible sequences. All three steps F11, F12, and F13 are also executed in FIG. 1F, but it is also possible to execute only one or two of these steps instead of all three.

In step F14 the identification information decoding unit 31 sets the decoded identification information S25 to the high quality audio device 82B, and operation then ends in step F16. In step F15, the identification information decoding unit 31 sets the decoded identification information S25 to television 82A, and operation then ends in step F16.

The high quality audio device 82B is thus an audio device that meets the conditions defined in at least any one of steps F11, F12, and F13.

If the decoded identification information S25 denotes a television 82A (according to another aspect, if the decoded identification information S25 includes an information representing a television 82A), the parameter value selection unit 13 selects reference parameter value S22. If the decoded identification information S25 denotes a high quality audio device 82B with higher sound quality than the sound quality of the television 82A (according to another aspect, if the decoded identification information S25 includes an information representing a high quality audio device 82B with higher sound quality than the sound quality of the television 82A), a high quality parameter value S23 that is lower than the reference parameter value is selected.

As described above, the transmission device 81 according to the embodiment of the invention uses identification information processing unit 25 and parameter value selection unit 13 to select high quality parameter value S23 as the selected parameter value N when the reception device is a high quality audio device, thereby reducing variation in the playback audio clock frequency FA1 of the reception device and improving the variation characteristic. As a result, the transmission device 81 according to the embodiment of the invention can improve sound quality in a transmission and reception system using an HDMI interface.

A transmission device according to the present invention can be used, for example, in an HDMI transmission device for home theater applications.

The invention can also be used in a variety of other transmission devices.

The invention being thus described, it will be obvious that it may be varied in many ways. Such variations are not to be regarded as a departure from the spirit and scope of the invention, and all such modifications as would be obvious to one skilled in the art are intended to be included within the scope of the following claims.

Terms described in the specification correspond to terms described in claims as follows.

Pixel clock SP is an example of a first clock. Audio clock SA is an example of a second clock. Parameter value selection unit 13 is an example of selection arrangement. Frequency division signal SAD is an example of a third clock. Frequency divider 11 is an example of frequency lowering arrangement. Counter 12 is an example of correlation detecting arrangement. The combination of content signal generating unit 15 and physical layer format conversion unit 14 is an example of transmission arrangement. Identification information processing unit is an example of information acquisition arrangement. Identification information ID is an example of allowable range information. Buffer memory is an example of compression arrangement.

What is claimed is:

1. A transmission device operable to transmit a first clock to a reception device, the transmission device comprising:
   a first reception arrangement operable to receive the first clock;
   a second reception arrangement operable to receive a second clock;
   a selection arrangement operable to select any parameter of plural parameters, each of the plural parameters representing a degree of lowering a frequency of the second clock;
   a frequency lowering arrangement operable to lower the frequency of the second clock received by the second reception arrangement based on the parameter selected by the selection arrangement to produce a third clock;
   a correlation detecting arrangement operable to detect a correlation between the first clock received by the first reception arrangement and the third clock produced by the frequency lowering arrangement;

a transmission arrangement operable to transmit the first clock, the parameter selected by the selection arrangement, and correlation information representing the correlation detected by the correlation detecting arrangement to the reception device; and an information acquisition arrangement operable to acquire allowable range information from the reception device, the allowable range information representing an allowable range of the parameter when the reception device reproduces the second clock as a fourth clock, wherein the reception device receives the first clock, the parameter, and the correlation information from the transmission arrangement to reproduce the second clock as the fourth clock based on the first clock, the parameter, and the correlation information, and the selection arrangement selects any of the plural parameters, each of the plural parameters representing the degree of lowering the frequency of the second clock based on the allowable range information acquired from the reception device.

2. The transmission device described in claim 1, further comprising:

a compression arrangement operable to compress an audio signal using the first clock, wherein the transmission arrangement transmits a video signal and the audio signal compressed by the compression arrangement to the reception device.

3. The transmission device described in claim 2, wherein the compression arrangement writes the audio signal to a buffer memory based on the second clock, and reads the audio signal from the buffer memory to compress the audio signal on time base.

4. The transmission device described in claim 2, wherein the transmission arrangement inserts the audio signal compressed by the compression arrangement, the parameter, and the correlation information to the video signal, and transmits the video signal as a content signal.

5. The transmission device described in claim 1, wherein the allowable range information includes information about at least one of a number of audio channels in the reception device, an audio sampling frequency in the reception device, and an audio encoding scheme in the reception device.

6. The transmission device described in claim 5, wherein the selection arrangement selects a smaller one of the plural parameters when the number of audio channels included in the allowable range information is at most two than when the number of the audio channels is greater than two.

7. The transmission device described in claim 5, wherein the selection arrangement selects a smaller one of the plural parameters when the audio sampling frequency included in the allowable range information is less than 96 kHz than when the audio sampling frequency is 96 kHz.

8. The transmission device described in claim 5, wherein the selection arrangement selects a smaller one of the plural parameters when the audio encoding scheme included in the allowable range information includes only a non-compression scheme than when the audio encoding scheme includes a compression scheme.

9. The transmission device described in claim 1, wherein:

the selection arrangement selects a smaller one of the plural parameters when the information acquisition arrangement determines that the reception device is an audio device than when the information acquisition arrangement determines that the reception device is a television.

* * * * *